United States Patent [19]
Schroeder

[11] 4,296,429
[45] Oct. 20, 1981

[54] VMOS TRANSISTOR AND METHOD OF FABRICATION

[75] Inventor: James E. Schroeder, Indialantic, Fla.

[73] Assignee: Harris Corporation, Melbourne, Fla.

[21] Appl. No.: 97,457

[22] Filed: Nov. 26, 1979

Related U.S. Application Data

[62] Division of Ser. No. 932,232, Aug. 9, 1978.

[51] Int. Cl.³ ............................................ H01L 29/06
[52] U.S. Cl. ...................................... 357/55; 357/23; 357/91
[58] Field of Search ............................. 357/55, 23, 91

[56] References Cited

U.S. PATENT DOCUMENTS

| | | | |
|---|---|---|---|
| 3,975,221 | 8/1976 | Rodgers | 148/191 |
| 4,003,036 | 1/1977 | Jenne | 340/173 R |
| 4,003,126 | 1/1977 | Holmes | 29/571 |
| 4,065,783 | 12/1977 | Ouyang | 357/41 |
| 4,084,175 | 4/1978 | Ouyang | 357/55 |
| 4,105,475 | 8/1978 | Jenne | 148/175 |
| 4,116,720 | 9/1978 | Vinson | 148/1.5 |
| 4,156,289 | 3/1979 | Hoffmann | 365/182 |
| 4,173,765 | 11/1979 | Heald | 357/23 |
| 4,222,063 | 9/1980 | Rodgers | 357/45 |

Primary Examiner—Martin H. Edlow
Attorney, Agent, or Firm—Leitner, Palan, Martin & Bernstein

[57] ABSTRACT

A vertical insulated gate field effect transistor having a first conductivity layer, a second conductivity layer thereon, a third first conductivity layer thereon, a groove extending from the surface of the third layer through the second layer into the first layer, a layer of insulation and gate material in the groove and a shallow first conductivity vertical region extending from the third layer into the second layer along the groove to form a short channel in the second layer with a shallow device junction.

The device is fabricated by masking the three semiconductor layers and etching the third layer and part of the second layer to form a groove, diffusing second conductivity impurities to a shallow depth in the groove, continuing the etching to extend the groove through the second layer into the first layer. A layer of insulation and gate material are formed in the groove to produce the vertical channel.

8 Claims, 6 Drawing Figures

VMOS TRANSISTOR AND METHOD OF FABRICATION

This is a division of application Ser. No. 932,232, filed Aug. 9, 1978.

BACKGROUND OF THE INVENTION

1. Field of the Invention

The present invention relates generally to insulated gate field effect transistors and more specifically to an improved insulated gate field effect transistor.

2. Prior Art

Insulated gate field effect transistors of the prior art are generally illustrated in FIGS. 1, 2, and 3.

The device shown in FIG. 1 is a planar IGFET consisting of diffused source and drain regions 14 formed in a body 12 of the opposite conductivity type. The conductive control electrode or gate 18 is separated from the source, drain and body by a thin insulating layer 20. FIG. 1 shows an N channel IGFET; however, the basic principles of operation are independent of polarity type.

The improvements to be described in this invention consist of means to minimize both the channel length L and the effective depth of the source and drain regions $x_{JS}$ and $x_{JD}$. In the device shown in FIG. 1, $x_{JS}$ and $x_{JD}$ are determined by the depth of the N+ diffusion used to fabricate the source and drain regions. The source-drain spacing determines the channel length L. The minimum channel length of the device shown in FIG. 1 is determined by the photolithographic tolerances that can be held during definition of the source and drain regions.

Operating speeds are inversely proportional to channel length; therefore it is desirable to make the channel as short as possible. For the device shown in FIG. 1, the minimum channel length is, in practice, limited by the resolution obtainable in the photolithographic process.

For very short channel devices, a second phenomenon may determine the minimum channel length. For a fixed drain bias, there will be a space charge region associated with the drain-substrate junction. If the width of this space charge region is greater than L, the gate electrode may not be able to effectively control the conductivity of the channel region. Although an exact analysis of this "punch-through" condition is quite involved, in general the effect is minimized by making $x_{JS}$ and $x_{JD}$ as small as possible. In the realization of the device shown in FIG. 1, $x_{JS}$ and $x_{JD}$ are minimized by ion implantation and by the use of slow diffusing impurities such as arsenic or antimony.

Improvements in the prior art of FIG. 1 are shown in FIG. 2 and FIG. 3. In both devices, the channel length is defined by controlling the depth of a conducting layer diffused from the surface. This gives shorter practical channel lengths than are usually obtained with the device shown in FIG. 1.

The FIG. 2 device includes a source layer 10, a body region 12, and a surface drain region 14. A gate material 18 is formed in groove 16 and separated therefrom by an insulated layer 20. The channel of the VMOS device has a length L between the surface drain 14 and the source layer 10. The depth $x_{JD}$ of the drain 14 is defined from the channel. The prior art device of FIG. 2 has a length L and drain junction depth $x_{JD}$.

An improvement over the prior art device of FIG. 2 is illustrated in FIG. 3. The prior art device of FIG. 3 includes a region 22 extending into layer 12 of the same conductivity type as the drain region 14. Region 22 reduces the length of the channel but increases the depth of the drain region relative to the gate surface. Similarly, it should be noted that FIG. 3 illustrates a generally U-shaped vertical groove compared to the V-shaped vertical groove of FIG. 2. This specific shape of the groove is interchangeable and would depend on the method of fabrication. The impurity regions of the prior art devices are formed before the groove and gate. The subsequent processing increases the depth of the regions and consequently alters the channel length.

For the devices shown in FIGS. 2 and 3, the minimum channel length is limited by punchthrough. The device shown in FIG. 3 minimizes the punchthrough effect somewhat by allowing the drain-substrate space charge region to spread partially through the lightly doped region 22. As shown in the figures, the effective depth of the drain junction is determined by the distance from the edge of the groove to the edge of the N+ region, and in practice, is limited by a combination of photolithograph, alignment and etch tolerances.

Prior art devices have thus failed to simultaneously minimize channel length L and drain depth $x_{JD}$ to produce a high performance IGFET.

SUMMARY OF THE INVENTION

The vertical insulated gate field effect transistor of the present invention minimizes channel length and junction depth by forming a narrow extension of the surface drain region along the contours of the groove. The depth of the extension from the groove defines the junction depth $x_{JD}$ and the distance between the end of the extension and the first layer of the same conductivity type define the channel length. The process of fabrication includes the standard formation of a first layer or region of a first conductivity type on a second layer or substrate of a second conductivity type opposite the first conductivity type, the selective formation of a first surface region of the second conductivity type in said first layer or region and masking of the surface to define the groove to be etched. The wafer is then partially etched through the second conductivity type surface region, and the first layer or region terminating short of the second layer or substrate. Second conductivity type impurities are then implanted or diffused into the partial groove forming the extensions of the second conductivity type surface region. The etching is then continued through the first layer or region into the second layer or substrate. Oxide or other insulating material is then formed in the groove and a gate material is formed over the oxide in the groove. The resulting structure is a vertical gate field effect transistor having a minimum channel length L and junction depth $x_{JD}$. The groove is a V-shaped or truncated V-shaped groove formed by anisotopic etching of a material with [100] crystal surface plane orientation.

OBJECTS OF THE INVENTION

Accordingly it is an object of the invention to provide a vertical insulated gate field effect transistor which optimizes and minimizes channel length L and junction depth $x_{JD}$.

Another object of the invention is to provide a method of fabricating a vertical gate field effect transistor having minimum channel length L and junction depth $x_{JD}$.

An even further object is to provide a method of fabrication of a vertical insulated gate field effect transistor wherein the effect of the gate formation and the channel length and junction depth is minimized.

These and other objects of the present invention will become apparent when considered in conjunction with the accompanying drawings.

DETAILED DESCRIPTION OF THE INVENTION

Figure 1:
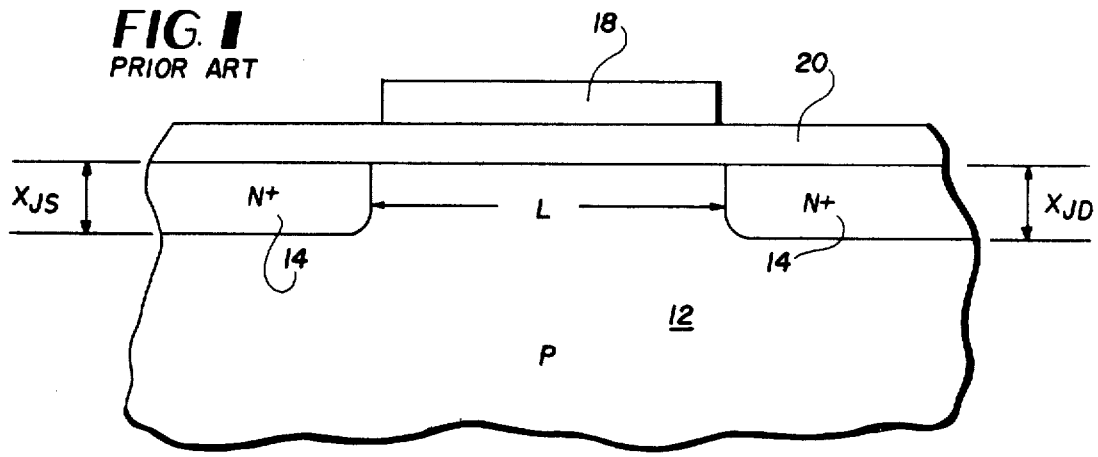
FIG. 1 is a cross-sectional view of an insulated gate field effect transistor of the prior art.
Figure 2:
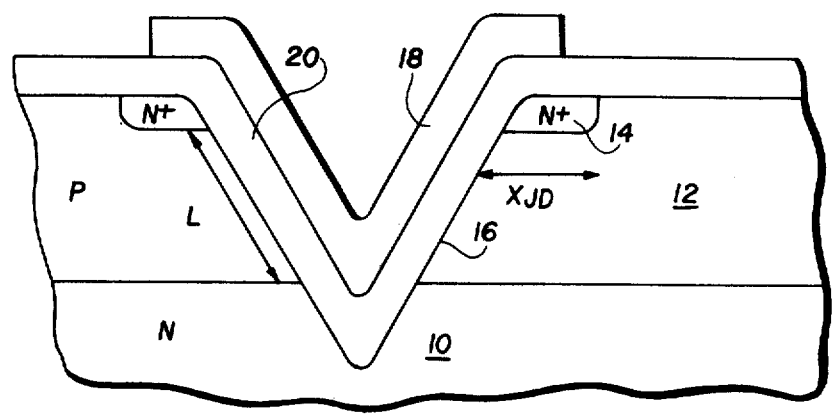
FIGS. 2 and 3 are cross-sectional views of vertical insulated gate field effect transistors of the prior art.
Figure 3:
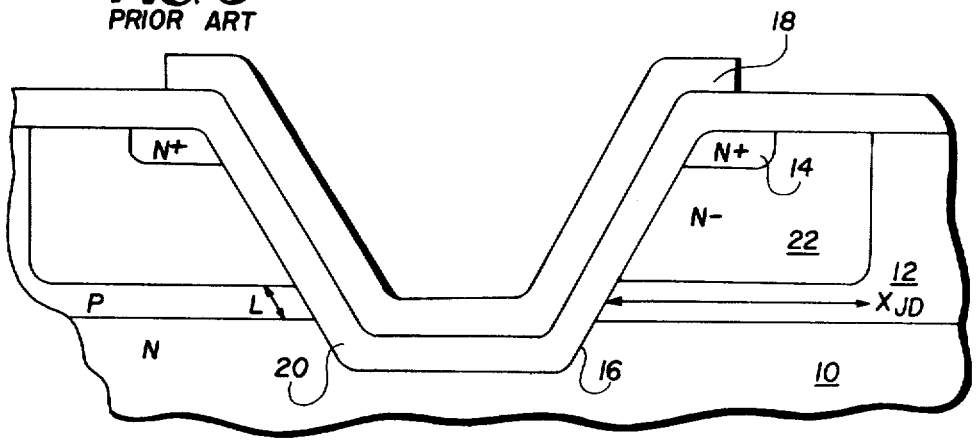

FIG. 2 depicts an N channel, vertical, insulated gate field effect transistor of the prior art having a source region 10, a body region 12, and a surface drain region 14. A gate 18 lies in the groove 16 and is separated therefrom by an insulated layer 20. The device of FIG. 4 incorporating the principles of the present invention, includes an extension 24 of the drain 14 extending along and contouring the groove 16 and terminating short of the source region 10. The length of the channel is the distance between the extension 24 and the source region 10 and the junction depth of the drain $x_{JD}$ is the depth of the extension 24 from the groove. As can be seen relative to FIGS. 2 and 3, the channel length L and the junction depth $x_{JD}$ have been minimized.

Figure 4:
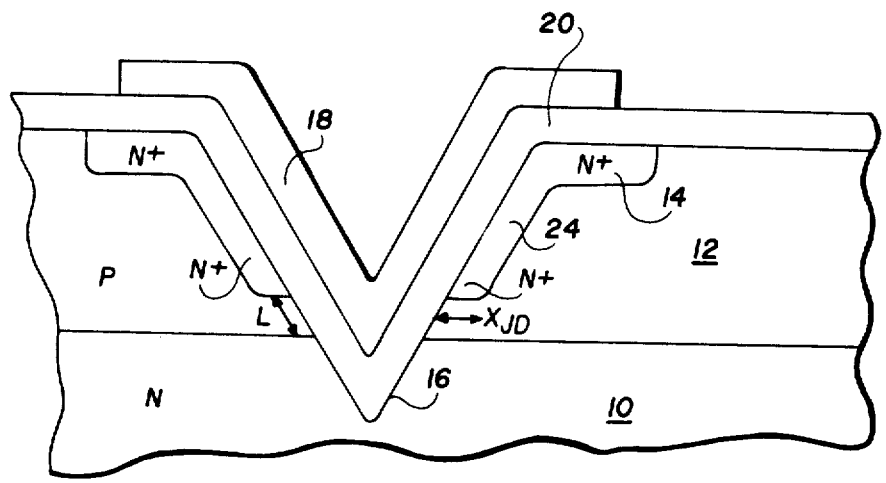
FIG. 4 is a cross-sectional view of a vertical insulated gate field effect transistor incorporating the principles of the present invention.

The process of fabrication of the device of FIG. 4 begins after the standard formation of base or substrate 10, layer 12 and surface region 14. To form the device of FIG. 4, layer 10 is a substrate of an N conductivity type having an impurity concentration of, for example, $10^{18}$ to $10^{20}$ atoms per cubic centimeter, layer 12 may be an epitaxial layer of P conductivity type having an impurity concentration of, for example, $10^{14}$ to $10^{16}$ atoms per cubic centimeter, and surface region 14 may be formed by selectively diffusing impurities, for example, phosphorous, arsenic or antimony, into the surface of a layer 12 to have an impurity concentration level of greater than $10^{19}$ atoms per cubic centimeter. Although illustrated as a substrate 10 and an epitaxial layer 12 and a diffused region 14, it is obvious that these regions may be formed by other methods. For example, the body region 12 may be formed by diffusing P type impurities into a N type substrate followed by the diffusion of N type impurities into region 12 to form surface region 14. Also, region 14 could be a second epitaxial layer.

Figure 5:
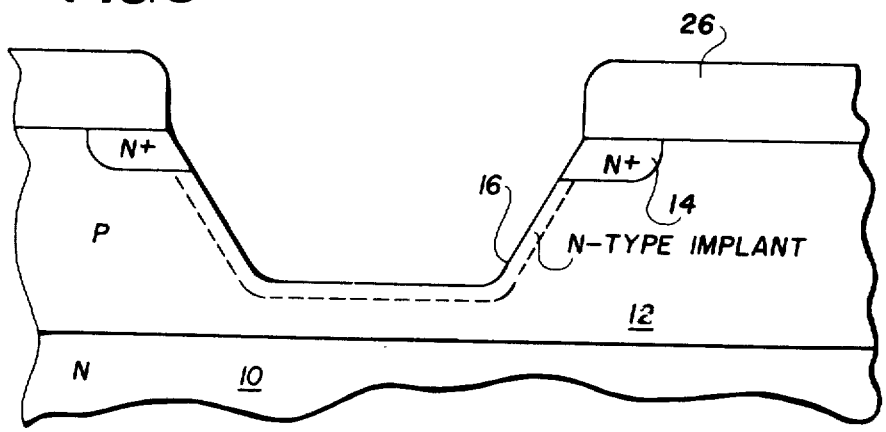
FIG. 5 is a cross-sectional view at one stage of the fabrication of a vertical field effect transistor of FIG. 4 according to the principles of the present invention.

After forming base 10, layer 12, and surface region 14, a mask is formed on the surface to delineate the groove to be formed in the substrate. As illustrated in FIG. 5, the masking material may be an insulating layer 26 formed on the surface. A photoresist layer is then formed on the insulating layer, exposed and developed to define the groove aperture. A suitable etchant is then used to begin the etch through surface region 14 and into layer 12. The etching is stopped short of the substrate 10. The distance between the bottom of the etched region and the substrate 10 defines the length of the channel to be formed. For a silicon substrate an etchant, for exmaple, KOH may be used.

Impurities are next introduced into the groove 16 along the contour thereof. Impurities, for example, antimony or arsenic, of the N conductivity type are introduced preferably by ion implantation. Alternatively they may be introduced by deposition in a conventional open tube deposition process. The wafer is then put back into the etchant and the etching process is continued until the groove 16 traverses the thickness of layer 12 and extends the groove into the substrate 10.

Figure 6:
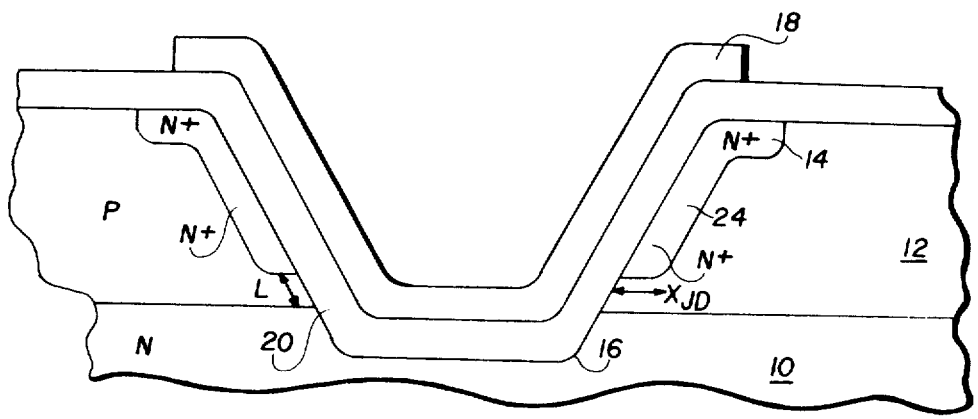
FIG. 6 is a cross-sectional view of another vertical gate field effect transistor incorporating the principles of the present invention.

The substrate 10 is selected to produce an epitaxial region 12 having a surface in the [100] plane. By providing such an orientation, a truncated V-shaped groove is anisotropic etched therein. The advantage of this orientation is that the initial etch will have a truncated V-shaped and the subsequent etching step will continue removing the region 12 below the original truncated V-shaped groove to form a substantially V-shaped groove. This type of etching produces substantially no side etching relative to the original groove walls. Although FIG. 4 illustrates a V-shaped groove, the aperture may be selected large enough relative to the depth of layer 12 to provide a truncated V-shaped groove as illustrated in FIG. 6 which extends from the surface through the epitaxial layer 12 into the substrate 10.

Subsequent to the final etching, an insulative layer 20 is formed in the groove and gate layer 18 is formed thereon. For example, the substrate may be silicon, the insulating layer 20 may be silicon dioxide and the gate metal 18 may be aluminum. Although the gate is illustrated as having a single insulating layer 20 and a single gate layer 18, it may be made to have three layers, for example, a silicon nitride layer therebetween. Similarily, the gate material 18 may be polysilicon or other well-known gate material. The final etching removes the implanted impurities only at the bottom of the truncated V-shaped groove. Since there is virtually no etching into the side walls of the groove during the final etch, the implanted impurities remain to form an extension of the surface region. Subsequent fabrication of the gate oxide and gate material causes the impurities to diffuse to the depth $x_{JD}$.

The device of FIGS. 4 or 5 incorporating the principles of the present invention may be formed to have a channel length L of less than 0.5 microns and a drain depth $x_{JD}$ of less than 0.1 microns. This is compared to a channel length L of approximately 0.5 microns and a drain depth $x_{JD}$ of greater than 3 microns for FIG. 3.

It are evident from the description above that the objects of the invention are obtained in that a vertical insulated gate field effect transistor is provided having a minimum channel length L and drain depth $x_{JD}$. Although the present invention has been described and illustrated in detail, it is to be clearly understood that the same is by way of illustration and example only and is not to be taken by way of limitation. The spirit and scope of the invention is to be limited only by the terms of the appended claims.

What is claimed:

1. In a vertical insulated gate field effect transistor having a first layer of a first conductivity type, a second layer of a second conductivity type on said first layer, a horizontal surface region in said seconod layer of said first conductivity type, a groove extending from said horizontal surface region through said second layer and into said first layer, a layer of insulation in said groove and a gate material in said groove and on said layer of insulation, the portion of said second region adjacent said gate material being a vertical channel between said first layer and said horizontal surface region, the improvement comprising a vertical surface region in the lateral surface of said second layer adjacent said gate, contiguous to said horizontal surface region and terminating vertically within said second layer, said vertical channel being between the end of said vertical surface region and said first layer.

2. The vertical insulated gate field effect transistor of claim 1 wherein said vertical surface region contours the groove.

3. The vertical insulated gate field effect transistor of claim 1 wherein said first layer is a silicon substrate and second layer is an epitaxial layer.

4. The vertical insulated gate field effect transistor of claim 1 wherein said first layer is a silicon substrate and said second layer is a diffused region in said substrate.

5. The vertical insulated gate field effect transistor of claim 1 wherein said groove is V-shape or a truncated V-shaped.

6. A vertical insulated gate field effect transistor comprising:
   a first semiconductor layer of a first conductivity;
   a second semiconductor layer of a second conductivity type opposite said first conductivity type on said first layer;
   a third semiconductor layer of said first conductivity on said second layer;
   a groove extending from said third layer through said second layer and into said first layer;
   a region of said first conductivity type extending along said groove from said third layer into said second layer and having a shallow depth from said groove;
   an insulating layer along the surface of said groove; and
   the channel of said transistor being the portion of said second layer adjacent said gate between the vertical termination of said region and said first layer.

7. The insulated gate field effect transistor of claim 6 wherein said first layer is a substrate, said second layer is an epitaxial layer and said third layer is a diffused region.

8. The insulated gate field effect transistor of claim 6 wherein said first layer is a substrate, said second layer is a diffused region in said substrate and said third layer is a diffused region in said second layer diffused region.

* * * * *